United States Patent [19]

Garskamp et al.

[11] Patent Number: 5,049,829
[45] Date of Patent: Sep. 17, 1991

[54] LOGARITHMIC AMPLIFIER WITH SEQUENTIALLY LIMITING AMPLIFIER STAGES

[75] Inventors: Arnoldus Garskamp; Cornelis J. M. Van Gils, both of Eindhoven, Netherlands

[73] Assignee: U.S. Philips Corporation, New York, N.Y.

[21] Appl. No.: 614,042

[22] Filed: Nov. 9, 1990

Related U.S. Application Data

[63] Continuation of Ser. No. 313,652, Feb. 21, 1989, abandoned.

[30] Foreign Application Priority Data

Feb. 29, 1988 [NL] Netherlands .......................... 8800510
Feb. 29, 1988 [NL] Netherlands .......................... 8800511

[51] Int. Cl.$^5$ ........................... G06G 7/24; G06G 7/12
[52] U.S. Cl. ..................................... 328/145; 307/492; 307/494
[58] Field of Search ............... 328/145, 156, 157, 158, 328/159; 307/492, 493, 494, 495, 498, 499

[56] References Cited

U.S. PATENT DOCUMENTS

| | | | |
|---|---|---|---|
| 3,991,301 | 11/1976 | Chaprnka | 328/145 |
| 4,090,150 | 5/1978 | Vauchenauer | 328/145 |
| 4,691,381 | 9/1987 | Bollard | 328/145 |
| 4,716,316 | 12/1987 | Colin | 328/145 |
| 4,758,793 | 7/1988 | Sheade et al. | 328/145 |

OTHER PUBLICATIONS

Barber et al., "A True Logarithmic Amplifier for Radar IF Applications", *IEEE Journal of Solid-State Circuits,* vol. SC.15, No. 3, Jun. 1980, pp. 291-295.

*Primary Examiner*—Stanley D. Miller
*Assistant Examiner*—Trong Phan
*Attorney, Agent, or Firm*—Robert J. Kraus

[57] ABSTRACT

In order to improve the large signal handling capability of a logarithmic amplifier comprising amplifier stages successively performing their limiting actions in response to an increase of the input signal, and an adder stage for the output signals of the amplifier stages, the signal of the amplifier stage which is the last to perform its limiting action in response to an increase of the signal is amplified by a value which is higher than that of the signals of the other amplifier stages.

6 Claims, 2 Drawing Sheets 5,049,829

LOGARITHMIC AMPLIFIER WITH SEQUENTIALLY LIMITING AMPLIFIER STAGES

This is a continuation of application Ser. No. 313,652 filed Feb. 21, 1989, now abandoned.

BACKGROUND OF THE INVENTION

The invention relates to a logarithmic amplifier comprising a plurality of limiting amplifier stages which successively perform their limiting actions in response to an increase of an input signal applied to an input terminal of the logarithmic amplifier, and whose signal outputs are coupled to an adder circuit for supplying an output signal which varies substantially logarithmically as a function of the input signal.

Logarithmic amplifiers of this type in which the outputs of the amplifier stages are coupled either directly or via respective demodulation circuits to the adder circuit are known, for example, from the Article "A True Logarithmic Amplifier for RADAR IF Applications", IEEE, *Journal of Solid State Circuits*, Vol. SC-15, No. 3, June 1980, pp. 291–295 or from the journal Frequenz, Vol. 39, No. 12, December 1985, pp. 320–324. Such logarithmic amplifiers are used, inter alia, for amplifying signals having a large dynamic range in which compression of large signal amplitudes is desired as, for example, in radar applications or in radiation detectors. Such logarithmic amplifiers may also be used advantageously in amplifiers for AM-modulated signals, example, of radio or TV receivers.

The logarithmic range of such logarithmic amplifiers is approximately equal to the product of the gain per amplifier stage and the number of amplifier stages. The gain per stage should be chosen comparatively low (for example, 12 db) in order to ensure a sufficiently correct logarithmic variation. The logarithmic range can thus be increased by incorporating more amplifier stages in cascade.

SUMMARY OF THE INVENTION

It is an object of the invention to provide a logarithmic amplifier of the type described in the opening paragraph in which a further improvement of the logarithmic variation can be achieved and to this end the logarithmic amplifier according to the invention is characterized in that the amplifier stage which is the last to perform its limiting action in response to an increase of the input signal is adapted to supply signals to the adder circuit with a gain which is one or more db's higher than the gain with which the other amplifier stages supply signals to the adder circuit.

BRIEF DESCRIPTION OF THE DRAWING

The invention will now be described in greater detail, by way of example, with reference to the accompanying drawing in which.

DESCRIPTION OF THE PREFERRED EMBODIMENT

Figure 1:
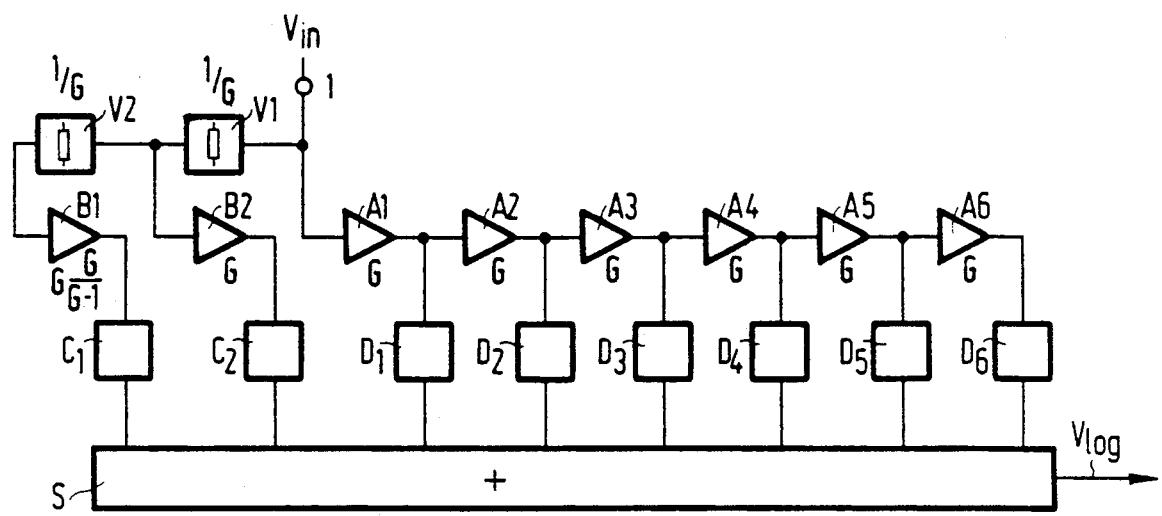
FIG. 1 is a block diagram of an embodiment of a logarithmic amplifier according to the invention.

The logarithmic amplifier of FIG. 1 comprises a cascade of limiting amplifier stages A1 to A6 all having the same gain G. An input terminal 1 connected to the input of the amplifier A1 receives an input signal Vi and the output signals of the stages A1 to A6 are demodulated in demodulation circuits D1 to D6, respectively. The demodulated signals are added in an adder circuit S. The output of the adder circuit is connected to an output terminal from which the logarithmically amplified and demodulated output voltage $V_{log}$ is derived.

In such a cascade of 6 amplifier stages each having a gain of 12 db and a limiting level of approximately 200 mV, the logarithmic range of the amplifier is between approximately 20 $\mu$V and 20 mV. If more amplifier stages are added to the cascade, the range of the logarithmic amplifier increases but it does not provide the possibility of improving the large-signal handling capability of the amplifier. By increasing the number of amplifier stages in the cascade, the sensitivity of the amplifier is enhanced but this is often unnecessary and, moreover, it jeopardizes the stability of the amplifier.

The large-signal handling capability of the circuit arrangement of FIG. 1 is essentially improved by the addition of two cascade-arranged attenuation circuits V1 and V2 each having an attenuation of 1/G and by the addition of a limiting amplifier stage B1 connected to the output of V2 and a limiting amplifier stage B2 connected to the output of V1. The amplifier stage B2 has a gain G and the amplifier stage B1 has a gain $G^2/G - 1$. The output signals of B1 and B2 are demodulated in demodulation circuits C1 and C2, respectively, and the signals thus demodulated are added in the adder circuit S to the demodulated signals of the demodulation circuits D1 to D6. Due to these measures the range of the amplifier in the case of large signals has increased from approximately 20 mV to approximately 800 mV. The attenuation circuits hardly impair the noise behaviour of the amplifier because it is the noise of the input of the stage A1 which, in view of the 6-stage gain for the noise, is by far the greatest contribution to the noise factor of the amplifier, whilst the noise generated by the additions described is negligible.

The stability of the amplifier is neither jeopardized because no more than 6 amplifier stages each having a 12 db gain, hence a total of 72 db, are arranged in cascade.

Figure 2:
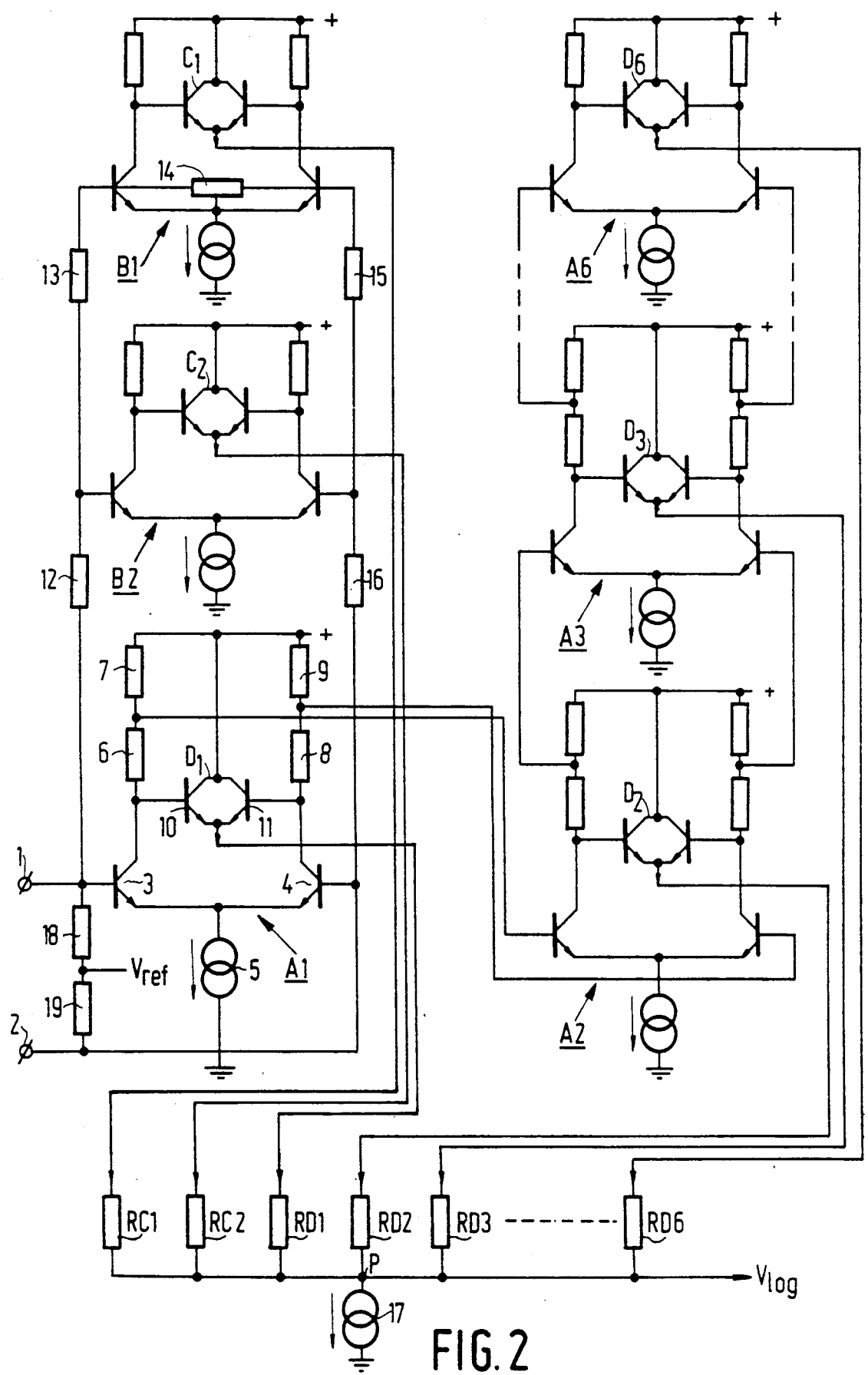
FIG. 2 is a detailed circuit diagram of a logarithmic amplifier according to the invention.

The reference numerals in FIG. 2 have the same significance as those in FIG. 1. The input signals are applied symmetrically or asymmetrically with respect to ground between the input terminals 1 and 2 which are connected to the base electrodes of two emitter-coupled transistors 3 and 4. A constant current source 5 is incorporated between the coupled emitter electrodes and ground. The collector electrodes of the transistors 3 and 4 are connected to a positive power supply terminal via series-arranged resistors 6, 7 and 8, 9, respectively. These collector electrodes are also connected to the base electrodes of two emitter-coupled transistors 10 and 11, respectively, whose collector electrodes are connected to the positive power supply terminal and whose coupled emitter electrodes are connected to a node P via a resistor RD1.

The elements 3, 4, 5, 6, 7, 8 and 9 jointly constitute the limiting amplifier stage A1 which is known to have a tanh transfer function. Its output voltage between the collector electrodes of the transistors 3 and 4 is full-wave rectified in the demodulation circuit D1 which is constituted by the elements 10, 11 and RD1. The signal amplified by the amplifier stage A1 and demodulated by the demodulation circuit D1 is applied via the resistor RD1 to the node P, which, in conjunction with a current source 17 connected to the node constitutes the adder circuit. The output signal $V_{log}$ of the logarithmic amplifier is taken off the node P.

A signal amplified with a gain of G by the amplifier stage A1 occurs between the connection of the collector resistors 6 and 7 and of the collector resistors 8 and 9, which signal is applied to the input terminals of the second amplifier stage A2 with the demodulation circuit D2. The stage A2/D2 is identical to the stage A1/D1 and therefore does not require any further description. The stages A1 and A2 are arranged in cascade, likewise as the subsequent stages A3 to A6. Each demodulation circuit D2 to D6 supplies its output signal to the node P via resistors RD2 to RD6. The amplifier stage A6 has undivided collector resistors because there is no subsequent amplifier stage. A reference voltage $V_{ref}$ is connected via two resistors 18 and 19 to the input terminals 1 and 2, respectively, in order to give these input terminals the correct bias. A dc stabilization can be obtained by providing, instead of the resistors 18 and 19, a dc negative feedback between the input terminals ½ and the collector electrodes of, for example, the amplifier stage A6.

The two amplifier stages B1 and B2 with their respective demodulation circuits C1 and C2 are constituted similarly as the stage A1/D1, but with undivided collector resistors.

A series arrangement of five resistors 12, 13, 14, 15 and 16 is connected between the input terminals 1 and 2. These five resistors operate as the cascade of the two attenuation circuits V1 and V2 of FIG. 1. The input terminals of the amplifier B2 are connected between the connection of the resistors 12 and 13 and the connection of the resistors 15 and 16. The input terminals of the amplifier B1 are connected between the connection of the resistors 13 and 14 and the connection of the resistors 14 and 15.

The attenuation from the terminals 1, 2 to the input terminals of B2 is:

$$\frac{R13 + R14 + R15}{R12 + R13 + R14 + R15 + R16}$$

and the attentuation from the input terminals of B2 to the inputs terminal of B1 is:

$$\frac{R14}{R13 + R14 + R15}.$$

With R12=R16=1200Ω, R13=R15=300Ω and R14=200Ω each of the two attenuations equals $1/G = \frac{1}{4} \approx -12$ db.

The gain factors of the amplifier stages are dimensioned by means of the collector resistors and of the current sources in the common emitter leads of the amplifier stages in such a way that the stages A1 to A5 have the correct gain G between their input terminals and the input terminals of the subsequent stage of the cascade, which gain corresponds to the attenuation of the two attenuation circuits (thus, G=4 in the example). The gain of all stages and their demodulation circuits for the signals to the node P are mutually equal (but not necessarily equal to G) with the exception of the stage B1/C1 which has a gain for these signals which is G/G−1 higher. This can be realized, for example, by choosing a higher value for the emitter current or for the collector resistors of B1 or a lower value for the resistor RC1.

Figure 3:
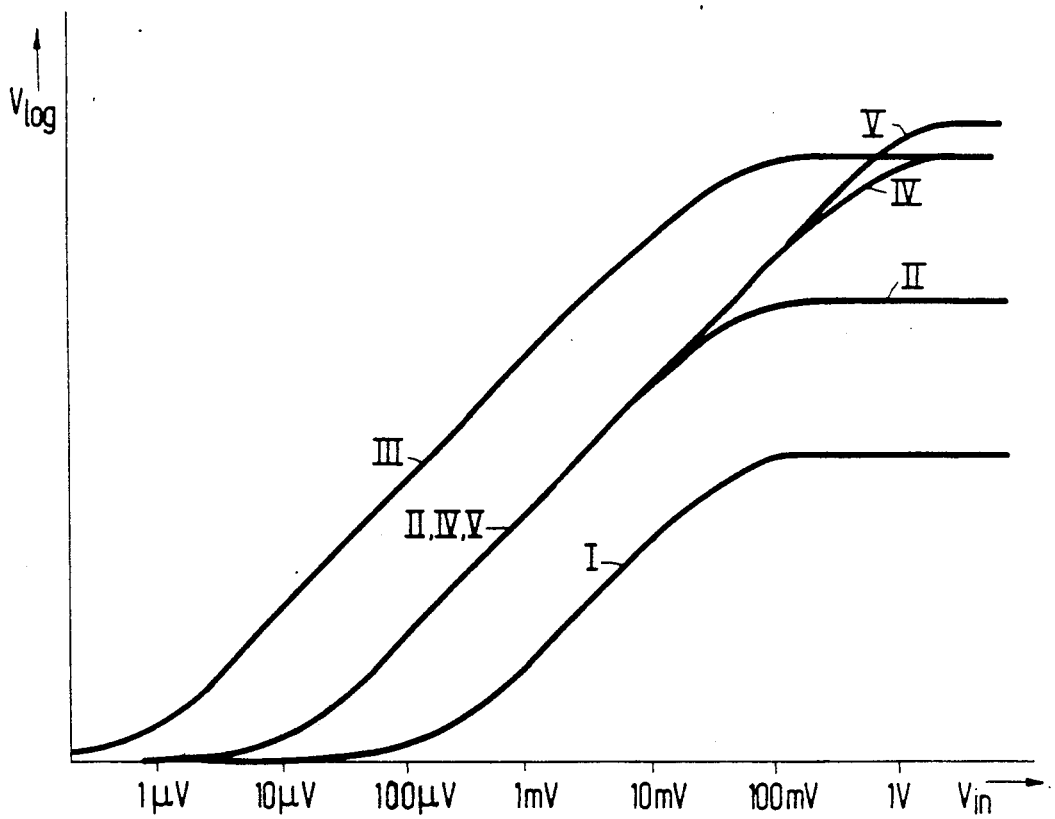
FIG. 3 shows some characteristic curves to elucidate the operation of a logarithmic amplifier according to the invention.

For the purpose of illustration FIG. 3 shows some transfer characteristic curves $V_{log}$ versus $V_i$ of logarithmic amplifiers. For all characteristic curves it holds that the amplifier stages have a tanh transfer function, a gain factor of G=4 and a limiting output level of approximately 200 mV.

The characteristic curve I holds for a logarithmic amplifier with a cascade of four amplifier stages. The characteristic curve II holds for a cascade of six amplifier stages and the characteristic curve III holds for a cascade of eight amplifier stages. It is clearly apparent that there is no longer any question of a logarithmic transfer function at Vi>approximately 20 mV.

The characteristic curve IV holds for a logarithmic amplifier with a cascade of six amplifier stages A1 to A6 and two additional stages B1 and B2 coupled to the input via attenuators, with all amplifier/demodulation stages having the same gain G=4 for the signals applied to the adder circuit. The characteristic curve V holds for the same logarithmic amplifier for which characteristic curve IV holds but in which the gain of the stage B1/C1 is increased by a factor of 4/3=G/(G−1). The transfer function is now logarithmic until approximately 800 mV.

It is to be noted that the improvement of the logarithmic variation due to the higher gain of the amplifier stage which is the last to perform its limiting action in response to an increase of the input signal can also be utilized in logarithmic amplifiers which do not use attenuation circuits for the input signal.

We claim:

1. A logarithmic amplifier comprising a plurality of limiting amplifier stages having respective outputs coupled to an adder for producing an output signal which varies substantially logarithmically as a function of a signal applied to an input of the amplifier, the stages being coupled to each other in a cascade arrangement for successively limiting output signals produced thereby in response to an increasing magnitude in a signal applied to the input of the amplifier, characterized in that the logarithmic amplifier includes:

a. a first plurality of cascaded amplifier stages having predetermined gains, an input of a first one of said stages being coupled to the input of the logarithmic amplifier and an output of each of said stages being coupled to an input of the adder;

b. a plurality of cascaded signal attenuating means, an input of a first one of said said means being coupled to the input of the logarithmic amplifier; and c. a plurality of limiting amplifier stages having predetermined gains, each of said stages having an output coupled to an input of the adder and having an input coupled to an output of a respective one of the signal attenuating means, the stage coupled to a last one of the cascaded signal attenuating means having a gain which is at least one db larger than the gain of any of the first plurality of cascaded amplifier stages.

2. A logarithmic amplifier as in claim 1 where each of the first plurality of cascaded amplifier stages has a gain of G and where the stage coupled to a last one of the cascaded signal attenuating means has a gain which is approximately [G²/G−1].

3. A logarithmic amplifier comprising a plurality of limiting amplifier stages having respective outputs coupled to an adder for producing an output signal which varies substantially logarithmically as a function of a signal applied to an input of the amplifier, the stages being coupled to each other in a cascade arrangement for successively limiting output signals produced thereby in response to an increasing magnitude in a signal applied to the input of the amplifier, characterized in that the logarithmic amplifier includes:
   a. a first plurality of cascaded amplifier stages having predetermined gains, an input of a first one of said stages being coupled to the input of the logarithmic amplifier and an output of each of said stages being coupled to an input of the adder;
   b. at least one signal attenuating means having an input coupled to the input of the logarithmic amplifier; and
   c. a limiting amplifier stage having an output coupled to an input of the adder, having an input coupled to an output of the at least one signal attenuating means, and having a gain which is at least one db larger than the gain of any of the first plurality of cascaded amplifier stages.

4. A logarithmic amplifier as in claim 3 where each of the first plurality of cascaded amplifier stages has a gain of G and where the stage coupled to the at least one signal attenuating means has a gain which is approximately [G²/G−1].

5. A logarithmic amplifier comprising a plurality of limiting amplifier stages having respective outputs coupled to an adder for producing an output signal which varies substantially logarithmically as a function of a signal applied to an input of the amplifier, characterized in that:
   a. the logarithmic amplifier includes at least one cascaded arrangement of said limiting amplifier stages, an input of the at least one cascaded arrangement being coupled to the input of the logarithmic amplifier and an output of each of the limiting amplifier stages in the at least one cascaded arrangement being coupled to a respective input of the adder;
   b. the plurality of limiting amplifier stages have predetermined gains for effecting in a predetermined sequence, from a first one of said limiting amplifier stages to a last one of said limiting amplifier stages, the limitation of output signals produced by said stages in response to an increasing magnitude of a signal applied to the input of the amplifier; and
   c. said last one of said limiting amplifier stages has a gain which is at least one db larger than the gain of any other one of said plurality of limiting amplifier stages.

6. A logarithmic amplifier as in claim 5 including at least two cascaded arrangements of said limiting amplifier stages, each of said cascaded arrangements having an input coupled to the input of the logarithmic amplifier.

* * * * *